United States Patent
Bandyopadhyay et al.

(10) Patent No.: US 6,380,047 B1
(45) Date of Patent: Apr. 30, 2002

(54) SHALLOW TRENCH ISOLATION FORMATION WITH TWO SOURCE/DRAIN MASKS AND SIMPLIFIED PLANARIZATION MASK

(75) Inventors: Basab Bandyopadhyay, Austin, TX (US); Nick Kepler, Saratoga, CA (US); Olov Karlsson; Larry Wang, both of San Jose, CA (US); Effiong Ibok, Sunnyvale, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/634,990

(22) Filed: Aug. 8, 2000

Related U.S. Application Data

(60) Provisional application No. 60/148,071, filed on Aug. 10, 1999.

(51) Int. Cl.[7] .............................................. H01L 21/76
(52) U.S. Cl. ...................... 438/427; 438/424; 438/433
(58) Field of Search ................................ 438/207, 218, 438/221, 294, 296, 353, 359, 424, 427, 433

(56) References Cited

U.S. PATENT DOCUMENTS 4,222,792 A * 9/1980 Lever et al. ................ 438/435

* cited by examiner

Primary Examiner—Matthew Smith
Assistant Examiner—Craig P. Lytle

(57) ABSTRACT

An insulated trench isolation structure with large and small trenches of differing widths is formed in a semiconductor substrate with improved planarity using a simplified reverse source/drain planarization mask. Embodiments include forming large trenches and refilling them with an insulating material which also covers the substrate surface, masking the areas above the large trenches, etching to remove substantially all of the insulating material on the substrate surface and polishing to planarize the insulating material above the large trenches. Small trenches and peripheral trenches surrounding the large trenches are then formed, refilled with insulating material, and planarized. Since the large trenches are formed prior to and separately from the small trenches, etching can be carried out after the formation of a relatively simple planarization mask over only the large trenches, and not the small trenches. The use of a planarization mask with relatively few features having a relatively large geometry avoids the need to create and implement a complex and critical mask, thereby reducing manufacturing costs and increasing production throughput. Furthermore, because the large and small trenches are not polished at the same time, overpolishing is avoided, thereby improving planarity and, hence, the accuracy of subsequent photolithographic processing.

17 Claims, 12 Drawing Sheets

SHALLOW TRENCH ISOLATION FORMATION WITH TWO SOURCE/DRAIN MASKS AND SIMPLIFIED PLANARIZATION MASK

RELATED APPLICATIONS

This application claims priority from U.S. provisional patent application No. 60/148,071, filed Aug. 10, 1999, and is incorporated herein by reference.

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by forming field oxide regions by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor.

A typical method of trench formation comprises initially growing a pad oxide layer on the substrate, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material such as silicon dioxide derived from tetraethyl orthosilicate (TEOS) to form a field oxide region. The insulating material is then planarized, as by chemical-mechanical polishing (CMP) using the barrier nitride layer as a polish stop, to remove all the oxide over the active regions so that only the trenches are filled. The nitride and pad oxide are stripped off the active areas to complete the trench isolation structure.

The planarization of the insulating material is a difficult process, because the field oxide regions vary widely in size. For example, one trench may have a width as little as 0.25 $\mu$, while an adjacent trench may be several microns wide. After the insulating material is deposited to fill the trenches and cover the polish stop, fissures called "seams" exist in the deposited insulating material above the smaller trenches, and indentations called "steps" exist in the upper surface of the insulating material above the large trenches. The steps are considerably wider than the seams; however, the seams are considerably deeper than the steps. The presence of both seams and steps is problematic during polishing, in that the greater amount of polishing required to remove the seams over the small features results in the removal of too much insulating material over the large features. This overpolishing of the insulating material above the large trenches produces undesirable "dishing" of the insulating material, resulting in a nonplanar insulating surface.

The problem of simultaneously planarizing an insulating material over both large and small features has been addressed by providing preliminary masking and etching steps, and then polishing, as by CMP. This technique is illustrated in FIGS. 1A–1C. Adverting to FIG. 1A, there is schematically illustrated the substrate 11, pad oxide layer 12, polish stop 13, oxide liner 14, trenches 15, insulating layer 16, seams 17 and steps 18. Inverse source/drain photoresist mask 19 is formed on the insulating layer 16 to protect the seams 17 and steps 18 from overetching. Isotropic etching is then performed to remove most of the insulating material in the active areas (FIG. 1B) before the final chemical-mechanical polish, as shown in FIG. 1C.

In principal this works very well. However, as the isotropic etch progresses, the contact area of photoresist mask 19 above small trenches 15 typically narrows down to a point. At this point, photoresist mask 19 detaches from insulating material 16, and the etch process then attacks seams 17. Seams 17 tend to be etched at a faster rate, since they are less compact, causing overetching and undesirable indentation around the seam. Ideally, it would be preferred to etch away all of insulating layer 16 on top of polish stop layer 13, then proceed with CMP to remove the remaining portions of insulating layer 16 (called "fences") followed by a short polish. However the indentation around seams 17 require a portion of insulating layer 16 be left on top of polish stop layer 13, so the indentation does not extend below the top surface of polish stop layer 13. This remaining portion of insulating layer 16 above polish stop layer 13 contributes to increased non-uniformity of the planarized top surface of insulating 16. Moreover, as minimum device critical dimension (CD) shrinks, indentation of seams 17 happens earlier in the etch process, requiring a higher oxide polish target.

Furthermore, the inverse source/drain mask 19 is a "critical mask"; i.e., it is complex and difficult to design and use. Still further, due to the topography of insulating material layer 16 prior to polishing, a relatively large depth of focus is required to produce mask 19.

Accordingly, there exists a need for a method of manufacturing a shallow trench isolation structure with improved field oxide planarity without the necessity of employing a complex critical mask.

SUMMARY OF THE INVENTION

An object of the present invention is a method of manufacturing a semiconductor device having insulated trenches formed in a semiconductor substrate, wherein an insulating material which fills the trenches and acts as the field oxide is planarized using a simplified, non-critical inverse source/drain mask.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having a plurality of trenches formed in a semiconductor substrate or in an epitaxial layer on the semiconductor substrate, which method comprises: forming a pad oxide layer on a main surface of the substrate or epitaxial layer; forming a polish stop layer having an upper surface on the pad oxide layer; forming a relatively large trench having side surfaces; depositing a first layer of an insulating material to fill the relatively large trench and cover the polish stop layer, whereby the first layer of the insulating material has a step in its upper surface above the relatively large trench; providing a planarization mask on the first layer of the insulating material above the step; etching to remove substantially all of the first layer of the insulating material on the polish stop layer; removing the planarization mask; performing a first polish to planarize such that an upper surface of the first layer of the insulating material is substantially flush with the upper surface of the polish stop layer; forming a relatively small trench, the relatively small trench having a width at the main surface less than a width at the main surface of the relatively large trench; forming a peripheral trench surrounding the relatively large trench and abutting the side surfaces of the relatively large trench, the peripheral trench having a width at the main surface less than the width at the main surface of the relatively large trench; thermally growing an oxide layer lining the relatively small trench and the peripheral trench; depositing a second layer of the insulating material to fill the relatively small trench and the peripheral trench and cover the polish stop layer; and performing a second polish to planarize such that an upper surface of the second layer of the insulating material is substantially flush with the upper surface of the polish stop layer.

Another aspect of the present invention is a semiconductor device comprising: a substrate or epitaxial layer formed in the substrate; a relatively large trench, formed in a main surface of the substrate or epitaxial layer, having side surfaces; a relatively small trench, formed in the main surface, having a width at the main surface less than a width at the main surface of the relatively large trench; a peripheral trench, formed in the main surface, surrounding the relatively large trench and abutting the side surfaces of the relatively large trench, the peripheral trench having a width at the main surface less than the width at the main surface of the relatively large trench; a thermally grown oxide liner in the relatively small trench and the peripheral trench; and an insulating material filling the relatively large trench, the relatively small trench, and the peripheral trench.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1A:
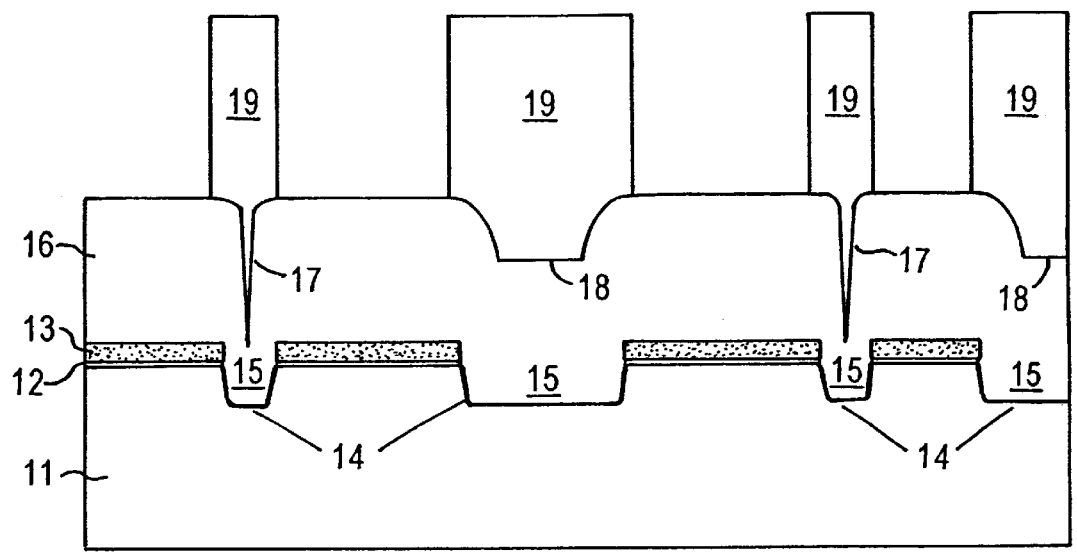
FIGS. 1A–1C schematically illustrate sequential phases of a method of STI formation requiring a complex inverse source/drain mask.
Figure 1B:
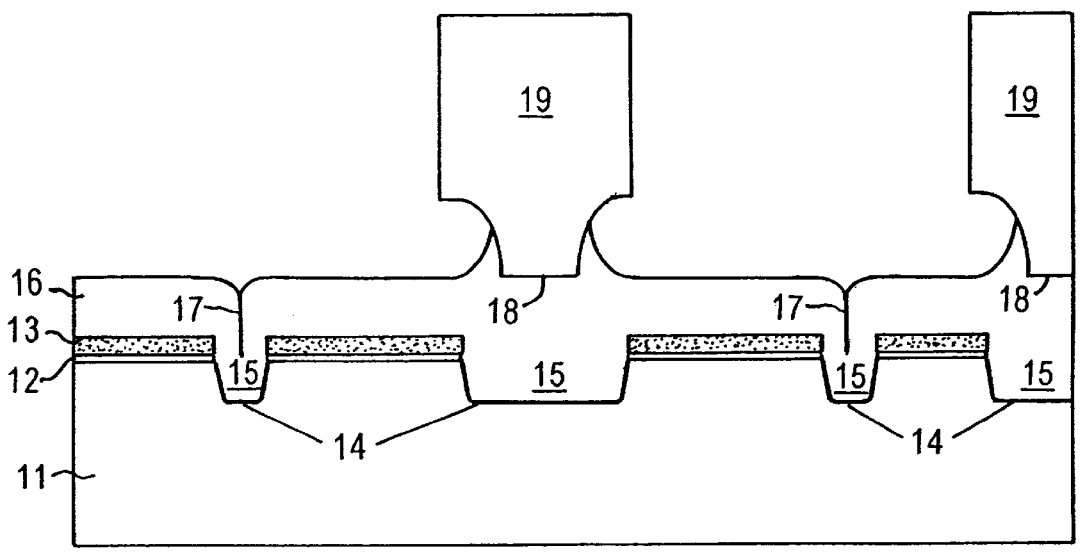
Figure 1C:
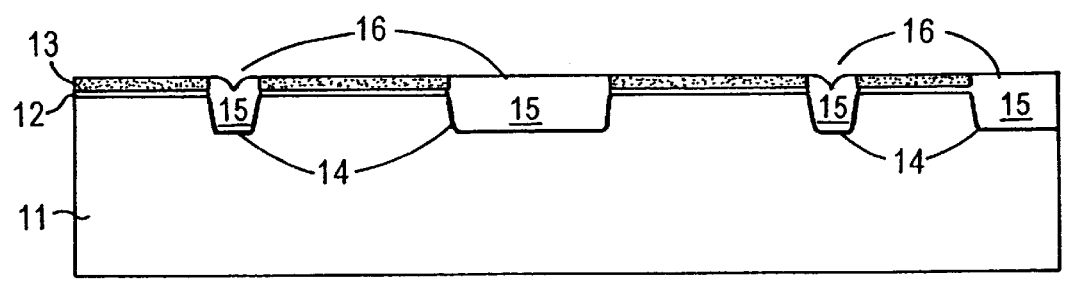

The use of a critical mask to planarize the insulating material filling the trenches disadvantageously increases the manufacturing costs and reduces production throughput. The present invention addresses and solves such problems by enabling the use of a simplified, non-critical mask during planarization, by treating seams and steps separately. Moreover, the present invention results in improved planarity of the insulating surface compared to methods utilizing a critical mask for planarization.

According to the methodology of the present invention, a first source/drain photoresist mask is formed on a polish stop layer which, in turn, is formed on a pad oxide layer on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

After masking, the substrate is etched to form large trenches, and an insulating material is deposited to fill the large trenches and cover the polish stop layer. A step is generally formed above each of the large trenches. A planarization mask is then formed on the insulating material above the large trenches, and the insulating material is etched to remove all the insulating material above the polish stop layer. Thereafter, the planarization mask is removed, and the insulating material is polished, as by CMP, until reaching the polish stop.

A second photoresist source/drain mask is then formed on the polish stop layer and above the large trenches, and the substrate is etched to form small trenches; i.e., trenches relatively smaller than the large trenches, whose width is smaller than that of the large trenches, and to form narrow peripheral trenches surrounding the large trenches. An oxide liner is grown in the small trenches and in the peripheral trenches. The peripheral trenches, having an oxide liner, function to provide isolation between the insulating material filling the large trenches and the silicon of the active areas of the substrate. The small and peripheral trenches are then filled with more of the insulating material, generally forming a seam above each of the small trenches and the peripheral trenches, but not forming any steps. The insulating material is then polished, as by CMP, until reaching the polish stop.

Since the inventive methodology forms and fills the large trenches separately from the small trenches, etching can be carried out after the formation of a relatively simple planarization mask over only the large trenches. Thus, the necessity for a critical mask is avoided. The inventive planarization mask is easier to design and implement than inverse source/drain planarization masks because it has fewer features, and its features have a relatively large geometry. Thus, the present invention enables a reduction in manufacturing costs and an increase in production throughput. Furthermore, since seams and steps are not polished at the same time, overpolishing and undesirable dishing of the insulating material above the large trenches is avoided.

Figure 2A:
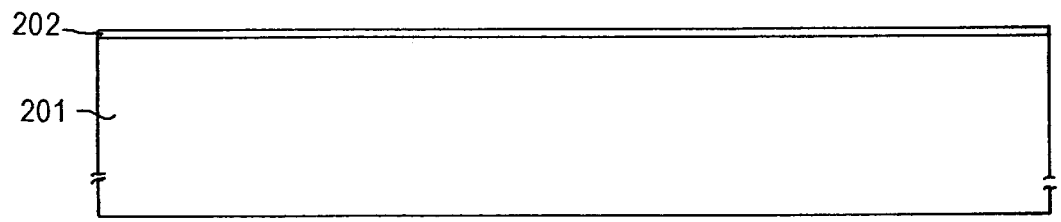
FIGS. 2A–2M schematically illustrate sequential phases of a method in accordance with an embodiment of the present invention.

An embodiment of the present invention is illustrated in FIGS. 2A–2M, wherein sequential phases in forming a semiconductor device in accordance with the present invention are depicted. Referring to FIG. 2A, substrate 201 is prepared having a substantially planar surface, typically a semiconductor substrate comprising doped monocrystalline silicon or an epitaxial layer formed on a semiconductor substrate in accordance with conventional practices. A pad oxide layer 202 is then grown on the substrate 201. Pad oxide layer 202 is typically silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer. FIG. 2A illustrates silicon substrate 201 and the pad oxide layer 202.

Figure 2B:
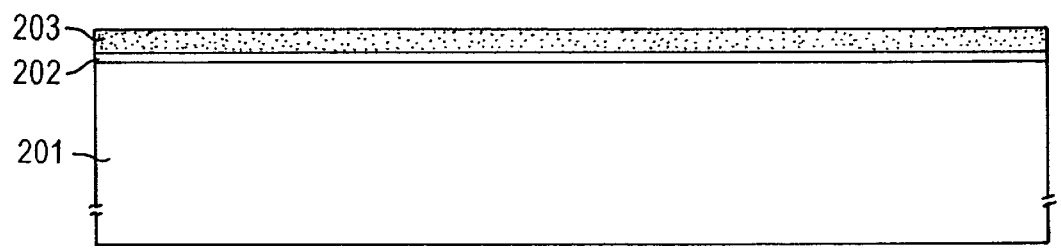

After formation of the pad oxide layer 202, a polish stop layer 203 is deposited on the pad oxide layer 202, as shown in FIG. 2B, such as a silicon nitride layer by CVD. Silicon oxide pad layer 202 functions as a buffer layer cushioning stresses between substrate 201 and polish stop layer 203. Polish stop layer 203 functions as an oxidation mask as it is resistant to the diffusion of oxygen and water vapor therethrough, thereby preventing an oxidizing species from reaching the underlying silicon substrate, as well as acting as a polish stop.

Figure 2C:
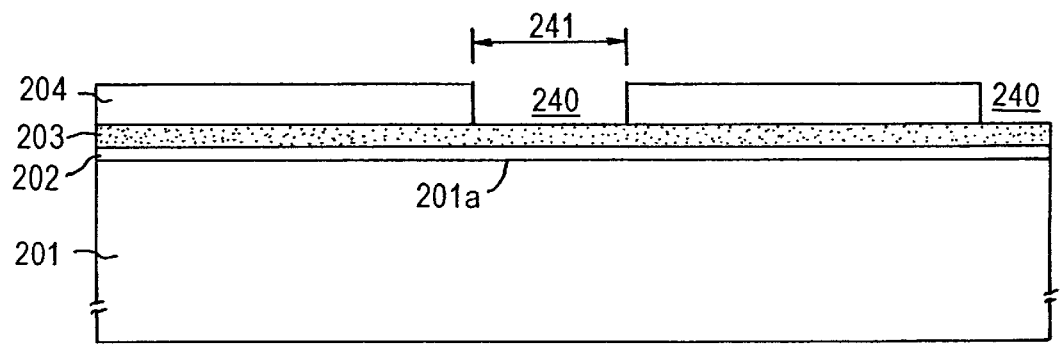
Figure 2D:
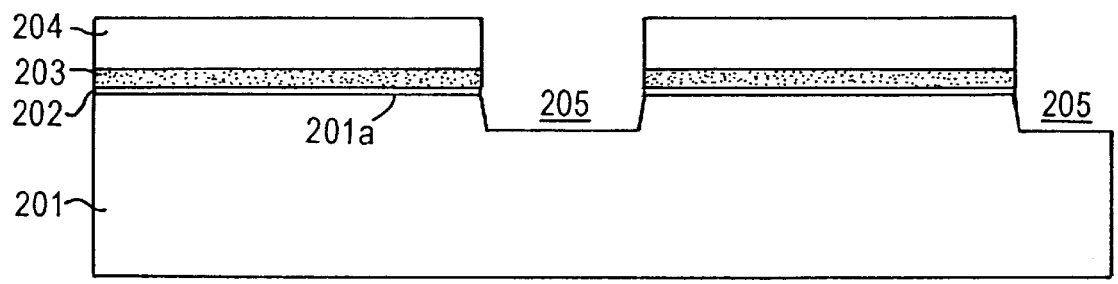

A first photoresist source/drain mask 204 is then formed on polish stop layer 203, as shown in FIG. 2C. First photoresist source/drain mask 204 has a pattern defined by openings 240, which generally have a width 241 substantially corresponding to the width of subsequently formed large trenches at the main surface 201a of the substrate 201. The polish stop layer 203 is then etched away, and the etching continues through the pad oxide layer 202 and into the substrate 201 to form the shallow large trenches 205 as shown in FIG. 2D. The large trenches 205 are typically etched to a depth of up to about 4000 Å. In practicing the present invention, a trench depth of about 2500 Å to about 3000 Å has been found particularly suitable. When the etching of the large trenches 205 is completed, the first photoresist mask 204 is stripped off the polish stop layer 203.

Figure 2E:
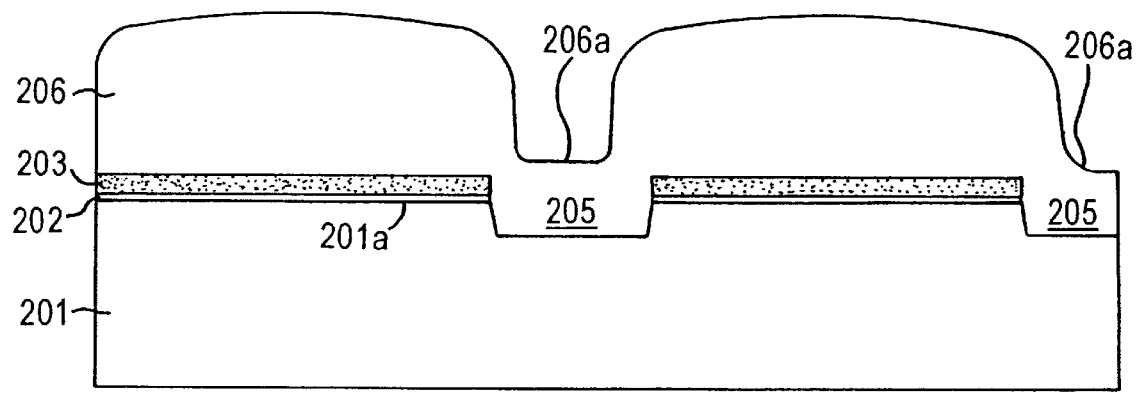

Thereafter, large trenches 205 are filled with a first layer 206 of a suitable insulating material, as shown in FIG. 2E, to a height above polish stop layer 203. Such insulating material 206 can comprise silicon dioxide derived from TEOS by LPCVD or derived from silane by LPCVD. The large trenches 205 can also be filled with a high density plasma (HDP) oxide. The thickness of insulating material 206 is such that the upper surface 206a of insulating material 206 above trenches 205 is slightly higher than the upper surface of polish stop layer 203.

Figure 2F:
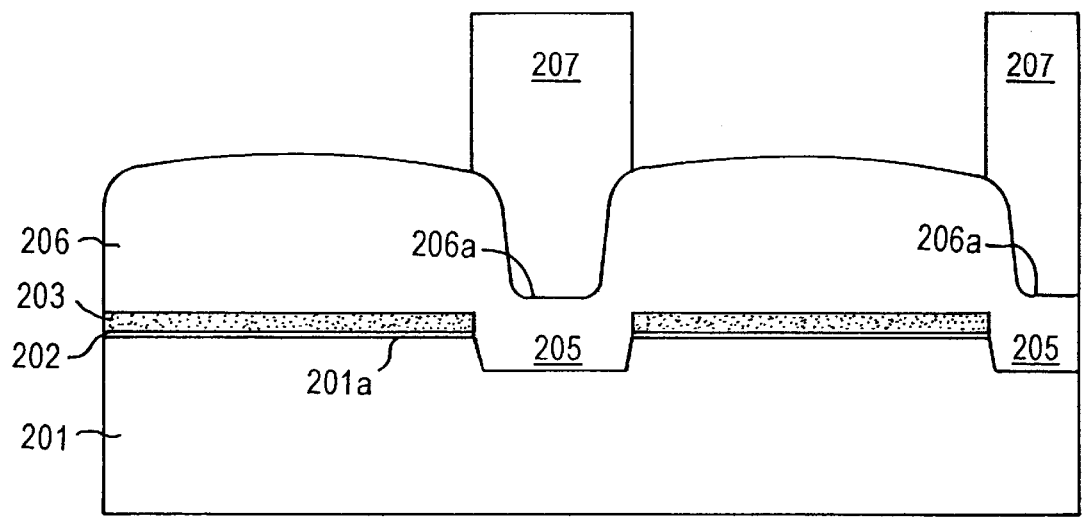
Figure 2G:
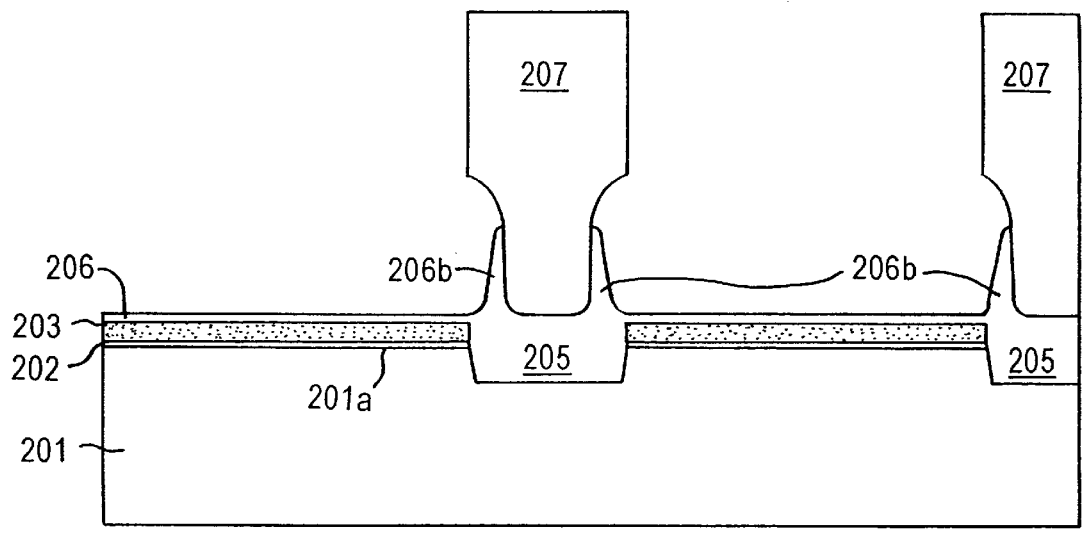
Figure 2H:
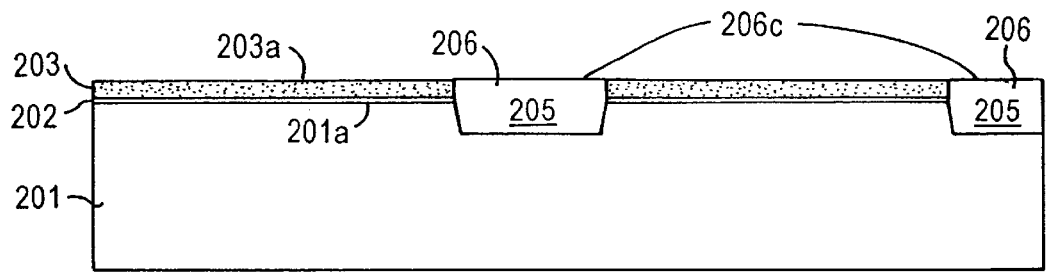

Subsequent to trench filling, a photoresist planarization mask 207 is formed on the first layer 206 of insulating material above the large trenches 205, as shown in FIG. 2F, and the first layer 206 of insulating material is isotropically etched, as shown in FIG. 2G, to remove substantially all of the insulating material 206 over the polish stop layer 203. Planarization mask 207 is then removed, leaving "fences" 206b, which are then polished away, as by CMP. A short polish is then performed to ensure that the upper surface 206c of insulating material 206 is flush with the upper surface 203a of polish stop layer 203, as shown in FIG. 2H.

Figure 2I:
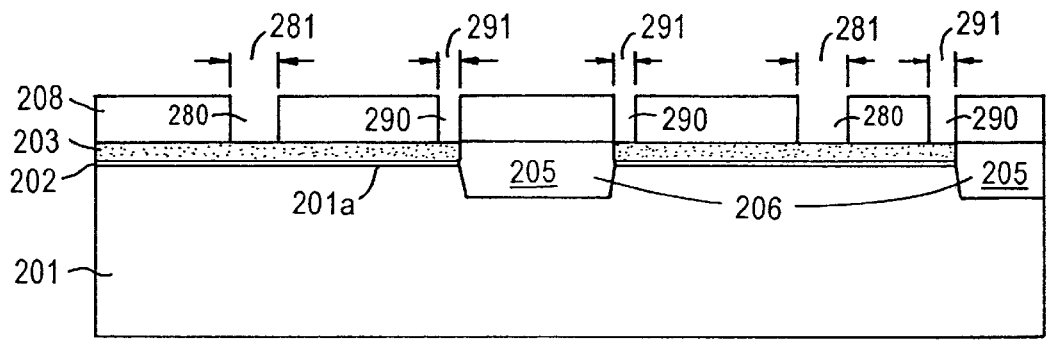
Figure 2J:
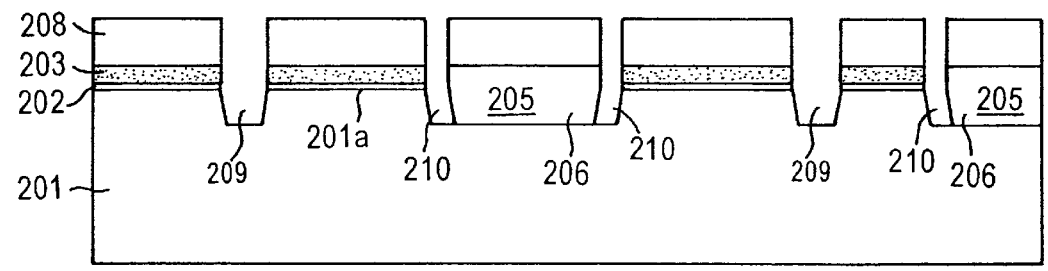

A second photoresist source/drain mask 208 is then formed on polish stop layer 203 and first layer 206 of insulating material, as shown in FIG. 2I. Second photoresist source/drain mask 208 has a pattern defined by openings 280, 290 which generally have a width 281, 291 substantially corresponding to the width of the subsequently formed trenches at the main surface 201a of the substrate 201. The polish stop layer 203 is then etched away, and the etching continues through the pad oxide layer 202 and into the substrate 201 to form the shallow small trenches 209 and shallow peripheral trenches 210, as shown in FIG. 2J. The peripheral trench openings 210 surround the large trenches 205 and abut the side surfaces of the large trenches 205. The peripheral trenches 210 have a width about equal to the minimum width required by the design rules of the semiconductor device; e.g., about 0.3 $\mu$. The trenches 209, 210 are typically etched to about the same depth as the large trenches 205; i.e., up to about 4000 Å, with a depth of about 2500 Å to about 3000 Å being particularly suitable. When the etching of the trenches 209, 210 is completed, the photoresist 208 is stripped off the polish stop layer 203.

Figure 2K:
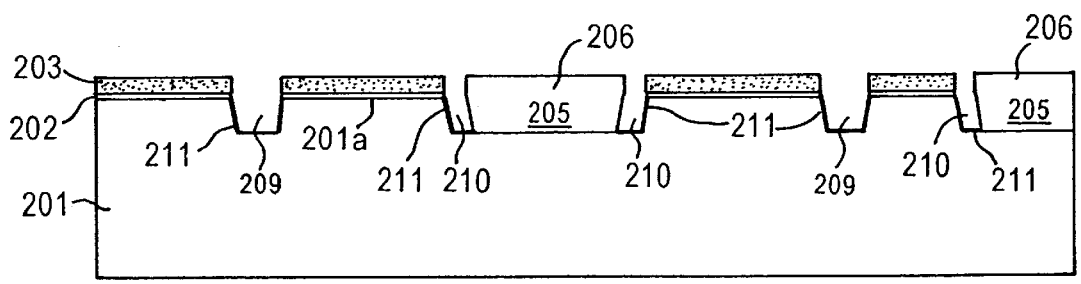
Figure 2L:
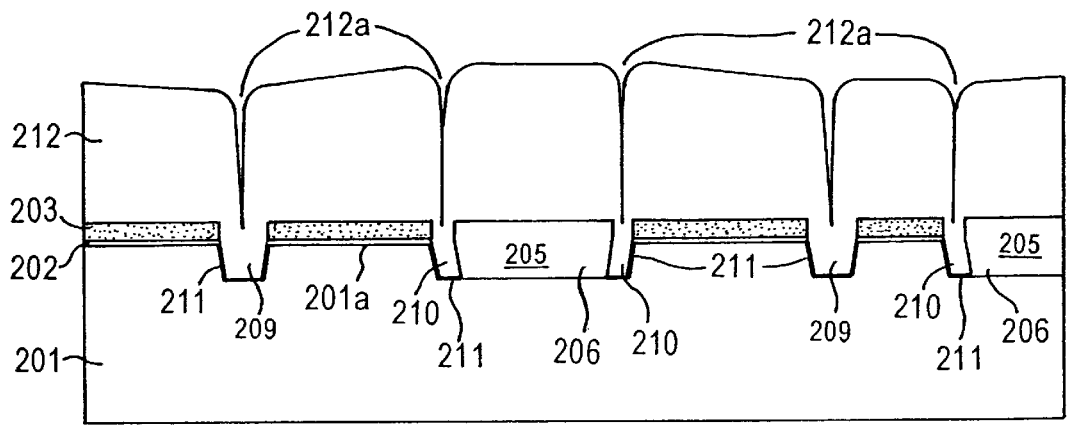

Thereafter, the surface of the trenches 209, 210 is thermally oxidized to form an oxide liner 211 on the inner surface of trenches 209, 210, typically at a temperature of about 1000° C. or higher. FIG. 2K shows the trenches 209, 210 with the completed liners 211. Subsequent to formation of the oxide liners 211, trenches 209, 210 are filled with a second layer 212 of the insulating material to a height above polish stop layer 203 using any of the techniques and materials discussed in reference to the deposition of the first layer 206 of insulating material, as shown in FIG. 2L. Alternatively, second layer 212 of insulating material may be a spin on layer, since the geometry to fill is relatively small, such as below 1 micron in width. Such materials may need an additional thermal cycle to cure. Due to the nature of the insulating material, after deposition the second layer 212 of insulating material has a seam 212a above each of the small trenches 209 and the peripheral trenches 210.

Figure 2M:
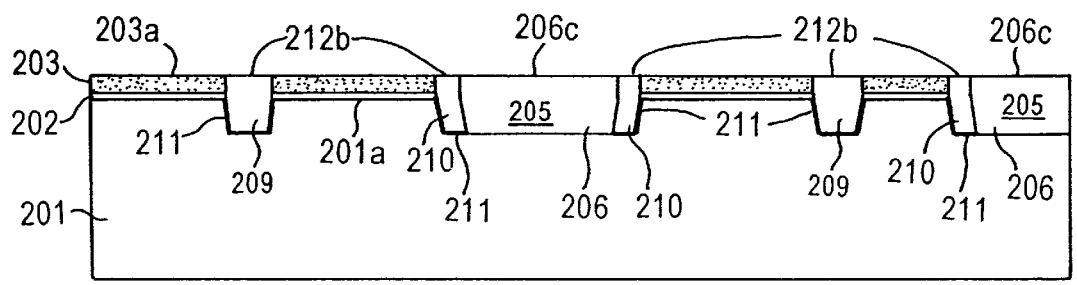

Subsequent to trench filling, the second layer 212 of insulating material is polished, as by CMP, such that the upper surface 212b of the second layer of insulating material 212 is substantially flush with the upper surface 203a of the polish stop layer 203 and the upper surface 206c of the first layer 206 of insulating material, as depicted in FIG. 2M. This polishing step is monitored in a conventional manner, as by measuring oxide over the polish stop layer.

Figure 3A:
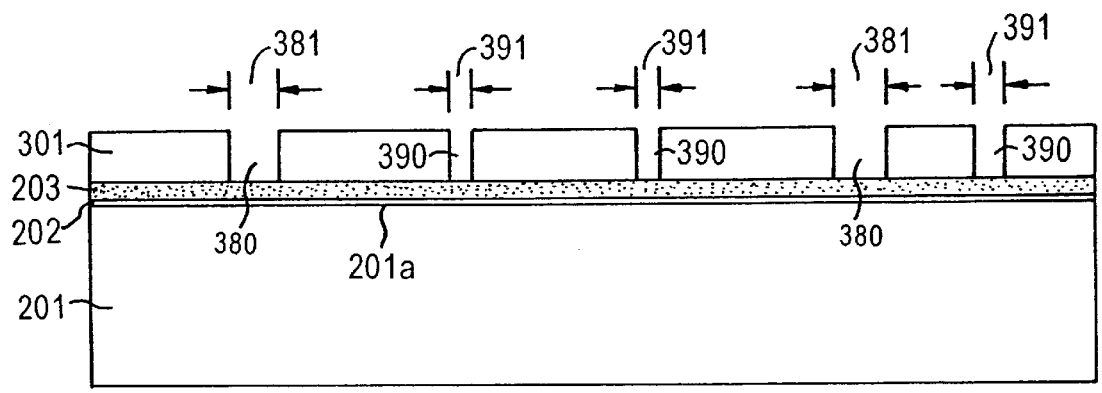
FIGS. 3A–3J schematically illustrate sequential phases of a method in accordance with another embodiment of the present invention.

In another embodiment of the present invention, as depicted in FIGS. 3A–3J, the small trenches and the peripheral trenches are formed first, followed by the relatively large trenches. Referring now to FIG. 3A, after pad oxide layer 202 and polish stop layer 203 are formed on main surface 201, a first photoresist source/drain mask 301 is formed on polish stop layer 203. First photoresist source/drain mask 301 has a pattern defined by openings 380, 390 which generally have a width 381, 391 substantially corresponding to the width of the subsequently formed trenches at the main surface 201a of the substrate 201.

Figure 3B:
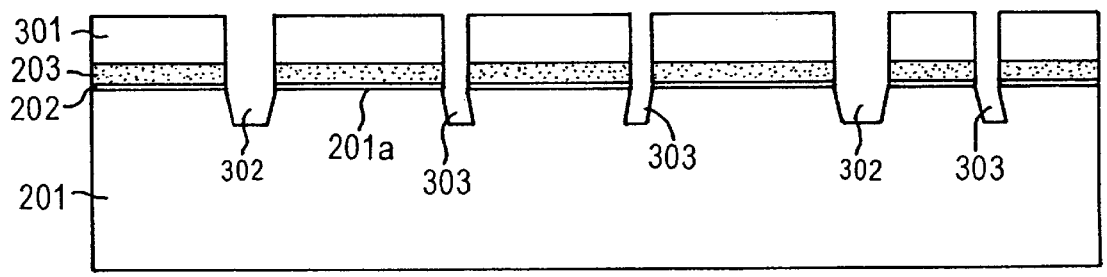

The polish stop layer 203 is then etched away, and the etching continues through the pad oxide layer 202 and into the substrate 201 to form the shallow small trenches 302 and shallow peripheral trenches 303, as shown in FIG. 3B. The peripheral trench openings 303 are sized to surround the subsequently formed large trenches and abut the side surfaces of the large trenches. As in the embodiment of FIGS. 2A–2M, the peripheral trenches 303 have a width about equal to the minimum width required by the design rules of the semiconductor device; e.g., about 0.3 $\mu$, and the trenches 209, 210 are typically etched to about the same depth as the large trenches 205 described above. When the etching of the trenches 302, 303 is completed, the photoresist 301 is stripped off the polish stop layer 203.

Figure 3C:
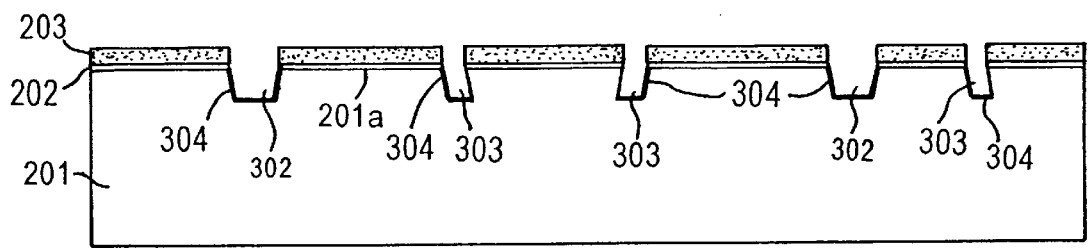
Figure 3D:
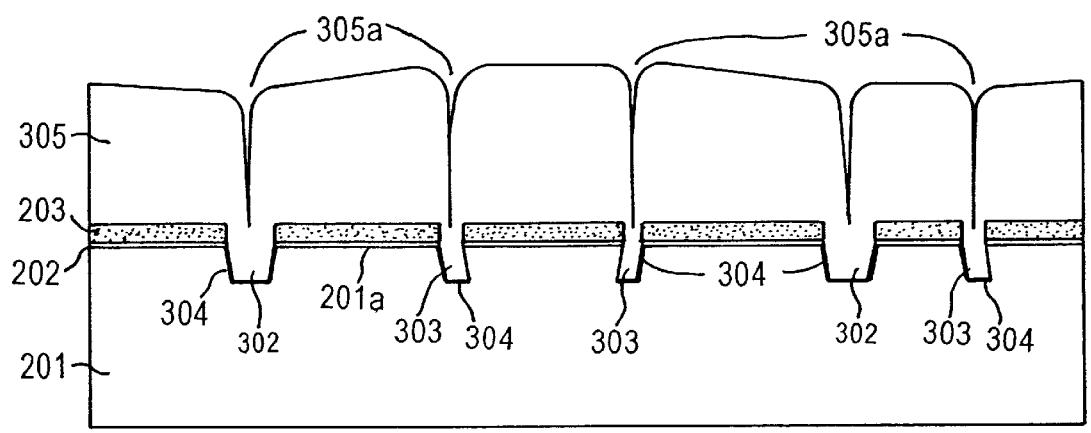

Thereafter, as shown in FIG. 3C, the surface of the trenches 302, 303 is thermally oxidized to form an oxide liner 304 on the inner surface of trenches 302, 303, typically at a temperature of about 1000° C. or higher. Subsequent to formation of the oxide liners 304, as shown in FIG. 3D, trenches 302, 303 are filled with a first layer 305 of the insulating material discussed in the embodiment of FIGS. 2A–2M to a height above polish stop layer 203 using any of the techniques and materials discussed above in relation to the formation of second insulating layer 212 (e.g., by deposition or a spin-on technique). Due to the nature of the insulating material, after formation the first layer 305 of insulating material has a seam 305a above each of the small trenches 302 and the peripheral trenches 303.

Figure 3E:
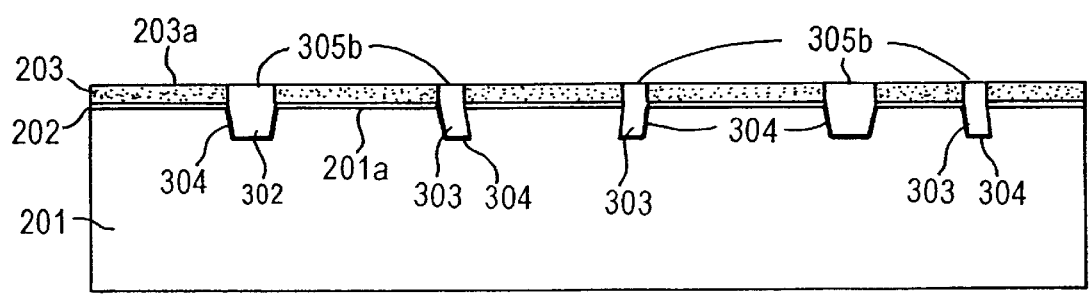

Subsequent to trench filling, the first layer 305 of insulating material is polished, as by CMP, such that its upper surface 305b is substantially flush with the upper surface 203a of the polish stop layer 203, as depicted in FIG. 3E. This polishing step is monitored in a conventional manner, as by measuring oxide over the polish stop layer.

Figure 3F:
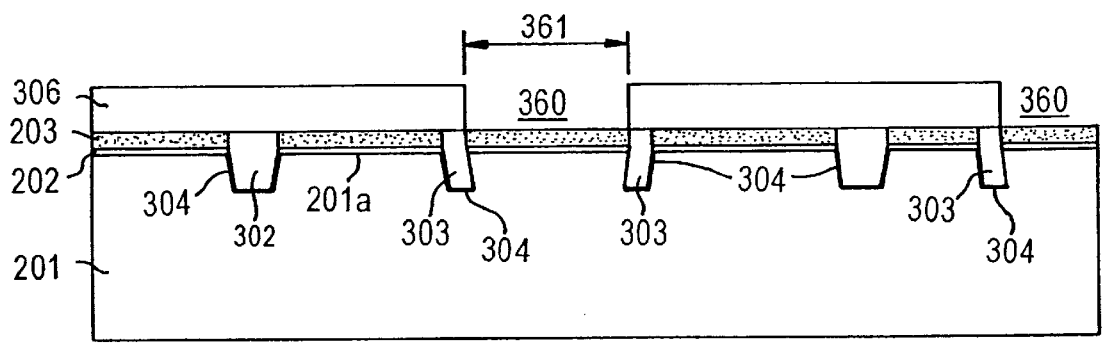
Figure 3G:
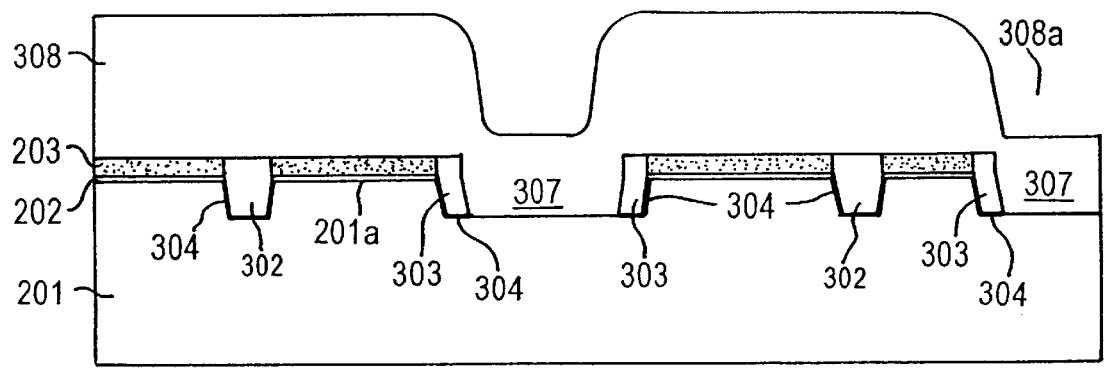

Next, a second photoresist source/drain mask 306 is then formed on polish stop layer 203, as shown in FIG. 3F. Second photoresist source/drain mask 306 has a pattern defined by openings 360, which generally have a width 361 substantially corresponding to the width of subsequently formed large trenches at the main surface 201a of the substrate 201, and cover small trenches 302 and peripheral trenches 303. The polish stop layer 203 is then etched away, and the etching continues through the pad oxide layer 202 and into the substrate 201 to form the shallow large trenches 307 as shown in FIG. 3G.

When the etching of the large trenches 307 is completed, the second photoresist mask 306 is stripped off the polish stop layer 203, and large trenches 307 are filled with a second layer 308 of the insulating material to a height above polish stop layer 203, using any of the deposition techniques discussed above. The thickness of insulating material 307 is such that its upper surface above trenches 307 is slightly higher than the upper surface of polish stop layer 203.

Figure 3H:
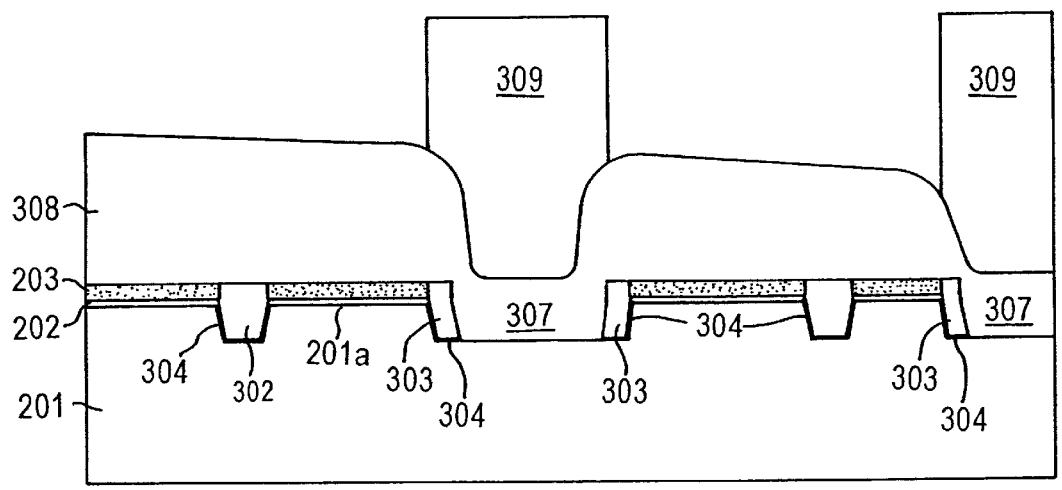
Figure 3I:
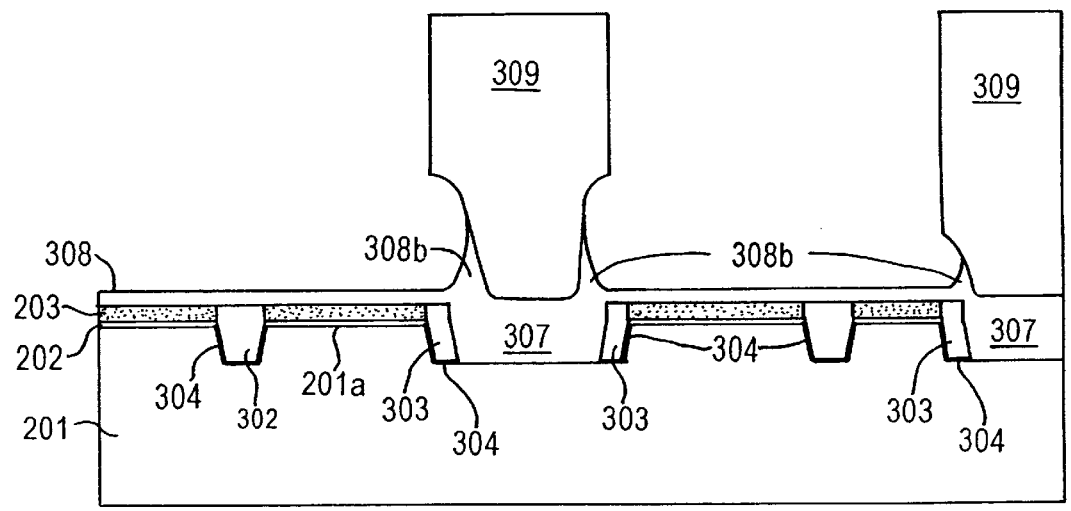
Figure 3J:
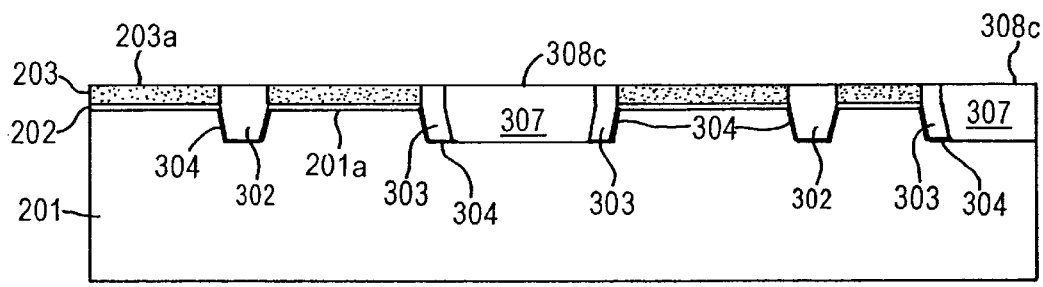

Subsequent to trench filling, a photoresist planarization mask 309 is formed on the second layer 308 of insulating material above large trenches 307, as shown in FIG. 3H, and second layer 308 of insulating material is isotropically etched, as shown in FIG. 3I, to remove substantially all of the insulating material 308 over the polish stop layer 203. Planarization mask 309 is then removed, leaving "fences" 308b, which are then polished away, as by CMP. A short polish is then performed to ensure that the upper surface 308c of insulating material 308 is flush with the upper surface 203a of polish stop layer 203, as shown in FIG. 3J.

Figure 4:
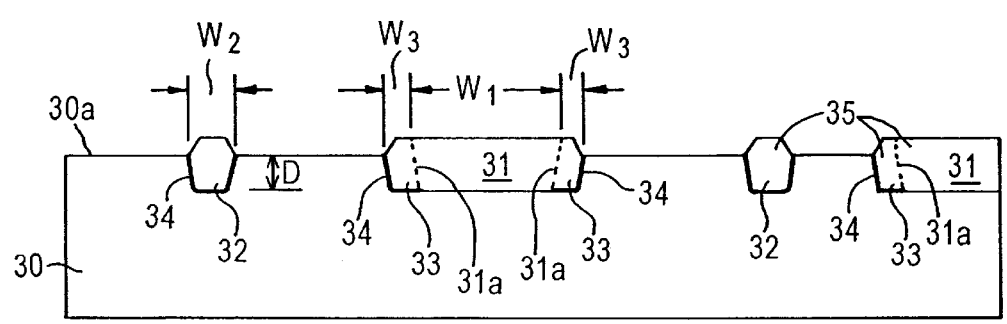
FIG. 4 is a cross-sectional view of a semiconductor device according to the present invention.

An embodiment of a semiconductor device in accordance with the present invention is described with reference to FIG. 4. The inventive semiconductor device comprises large trenches 31, small trenches 32 and peripheral trenches 33 formed in a main surface 30a of substrate 30. Small trenches 32 have a width $W_2$ at main surface 30a less than a width $W_1$ at main surface 30a of large trenches 31. The peripheral trenches 33 surround the large trenches 31 abutting side surfaces 31a of the large trenches 31, and have a width $W_3$ at main surface 30a less than the width $W_1$ at main surface 30a of the large trenches 31. Small trenches 32 and peripheral trenches 33 have a thermally grown silicon dioxide liner 34, and a silicon dioxide insulating material 35 fills the large trenches 31, the small trenches 32, and the peripheral trenches 33. The peripheral trenches typically have a width $W_3$ about equal to the minimum width required by the design rule of the semiconductor device; e.g., about 0.3 $\mu$ at the main surface 30a. The trenches 31, 32, 33 typically have a depth D of about 2500 Å to about 4000 Å; e.g., about 3000 Å.

According to the methodology of the present invention, the layers of insulating material filling the large trenches and the small trenches are planarized separately from each other. Thus, the steps above the large trenches and the seams above the small trenches are polished in separate operations. The inventive methodology thereby enables the use of a planarization mask which is simpler to make and use than reverse source/drain planarization masks, since it is only necessary to protect the thinner insulating material (i.e., the steps) over the large trenches The inventive planarization mask is generated by a relatively simpler algorithm than the reverse source/drain masks, since it is not necessary to locate and protect small features like seams. Moreover, because only larger and less numerous areas such as large trenches are masked, the planarization mask is relatively easy to use; e.g., it is easier to align, etc. Still further, since the steps and the seams are not polished at the same time, overpolishing of the insulating material above the large trenches is prevented, thereby improving planarity. Thus, the inventive method provides an increase in production throughput and an attendant economic benefit. The present invention is applicable to the manufacture of various types of semiconductor devices having STI, particularly high density semiconductor devices having a design rule of about 0.25 $\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having a plurality of trenches formed in a semiconductor substrate or in an epitaxial layer on the semiconductor substrate, which method comprises:

forming a pad oxide layer on a main surface of the substrate or epitaxial layer;

forming a polish stop layer having an upper surface on the pad oxide layer, forming a relatively large trench having side surfaces;
depositing a first layer of an insulating material to fill the relatively large trench and cover the polish stop layer, whereby the first layer of the insulating material has a step in its upper surface above the relatively large trench;
providing a planarization mask on the first layer of the insulating material above the step;
etching to remove substantially all of the first layer of the insulating material above the polish stop layer;
removing the planarization mask;
performing a first polish to planarize such that an upper surface of the first layer of the insulating material is substantially flush with the upper surface of the polish stop layer;
forming a relatively small trench, the relatively small trench having a width at the main surface less than a width at the main surface of the relatively large trench;
forming a peripheral trench surrounding the relatively large trench and abutting the side surfaces of the relatively large trench, the peripheral trench having a width at the main surface less than the width at the main surface of the relatively large trench;
thermally growing an oxide layer lining the relatively small trench and the peripheral trench;
depositing a second layer of the insulating material to fill the relatively small trench and the peripheral trench and cover the polish stop layer;
performing a second polish to planarize such that an upper surface of the second layer of the insulating material is substantially flush with the upper surface of the polish stop layer.

2. The method according to claim 1, comprising:
providing a first source/drain mask on the polish stop layer, the first source/drain mask containing an opening corresponding to the relatively large trench;
etching to remove portions of the underlying polish stop and pad oxide layers and to form the relatively large trench;
providing a second source/drain mask on the polish stop layer subsequent to performing the first polish, the second source/drain mask containing a pattern having an opening corresponding to the relatively small trench and an opening corresponding to the peripheral trench; and
etching to remove portions of the underlying polish stop and pad oxide layers and to form the relatively small trench and the peripheral trench.

3. The method according to claim 2, wherein the pad oxide layer comprises silicon oxide and the polish stop layer comprises silicon nitride.

4. The method according to claim 3, wherein each opening in each of the first and second source/drain masks has a width substantially equal to the width of one of the plurality of trenches at the main surface.

5. The method according to claim 3, comprising heating at a temperature of at least about 1000° C. to thermally grow a silicon oxide liner.

6. The method according to claim 3, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

7. The method according to claim 6, comprising polishing the insulating material by chemical-mechanical polishing.

8. The method according to claim 6, comprising isotropically etching the first layer of the insulating material.

9. The method according to claim 1, wherein the semiconductor device has a predetermined design rule, and the peripheral trench has a width about equal to the minimum width required by the design rule.

10. A method of manufacturing a semiconductor device formed in a semiconductor substrate or in an epitaxial layer on the semiconductor substrate, the semiconductor device comprising a relatively small trench and a relatively large trench having side surfaces and a width at the main surface greater than a width at the main surface of the relatively small trench, which method comprises:
forming a pad oxide layer on a main surface of the substrate or epitaxial layer;
forming a polish stop layer having an upper surface on the pad oxide layer;
forming the relatively small trench;
forming a peripheral trench for surrounding the subsequently formed relatively large trench and for abutting the side surfaces of the relatively large trench, the peripheral trench having a width at the main surface less than the width at the main surface of the relatively large trench;
thermally growing an oxide layer lining the relatively small trench and the peripheral trench;
depositing a first layer of an insulating material to fill the relatively small trench and the peripheral trench and cover the polish stop layer;
performing a first polish to planarize such that an upper surface of the first layer of the insulating material is substantially flush with the upper surface of the polish stop layer;
forming the relatively large trench after performing the first polish;
depositing a second layer of the insulating material to fill the relatively large trench and cover the polish stop layer, whereby the second layer of the insulating material has a step in its upper surface above the relatively large trench;
providing a planarization mask on the second layer of the insulating material above the step;
etching to remove substantially all of the second layer of the insulating material above the polish stop layer;
removing the planarization mask; and
performing a second polish to planarize such that an upper surface of the second layer of the insulating material is substantially flush with the upper surface of the polish stop layer.

11. The method according to claim 10, comprising:
providing a first source/drain mask on the polish stop layer, the first source/drain mask containing a pattern having an opening corresponding to the relatively small trench and an opening corresponding to the peripheral trench;
etching to remove portions of the underlying polish stop and pad oxide layers and to form the relatively small trench and the peripheral trench;
providing a second source/drain mask on the polish stop layer subsequent to performing the first polish, the second source/drain mask containing an opening corresponding to the relatively large trench; and
etching to remove portions of the underlying polish stop and pad oxide layers and to form the relatively large trench.

12. The method according to claim 11, wherein the pad oxide layer comprises silicon oxide and the Polish stop layer comprises silicon nitride.

13. The method according to claim 12, comprising heating at a temperature of at least about 1000° C. to thermally grow a silicon oxide liner.

14. The method according to claim 12, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

15. The method according to claim 14, comprising polishing the insulating material by chemical-mechanical polishing.

16. The method according to claim 10, comprising isotropically etching the second layer of the insulating material.

17. The method according to claim 10, wherein the semiconductor device has a predetermined design rule, and the peripheral trench has a width about equal to the minimum width required by the design rule.

* * * * *